United States Patent [19]
Duesman

[11] Patent Number: 5,539,347
[45] Date of Patent: * Jul. 23, 1996

[54] MEMORY DEVICE INITIALIZATION

[76] Inventor: Kevin G. Duesman, 4084 S. Suntree Way, Boise, Id. 83706

[*] Notice: The term of this patent shall not extend beyond the expiration date of Pat. No. 5,416,363.

[21] Appl. No.: 393,580

[22] Filed: Feb. 23, 1995

Related U.S. Application Data

[63] Continuation of Ser. No. 52,003, Apr. 22, 1993, Pat. No. 5,416,363.

[51] Int. Cl.$^6$ .................................................. H03K 3/284
[52] U.S. Cl. ........................ 327/198; 327/142; 327/143
[58] Field of Search .................................. 327/142, 143, 327/198, 544, 545, 546, 548; 365/226, 227

[56] References Cited

U.S. PATENT DOCUMENTS

| | | | |
|---|---|---|---|
| 3,562,555 | 2/1971 | Ahrons | 327/535 |
| 4,208,596 | 6/1980 | Guicheteau | 327/143 |
| 4,234,920 | 11/1980 | Van Ness et al. | 327/143 |
| 4,375,601 | 3/1983 | Van Kiet | 327/261 |
| 4,428,020 | 1/1984 | Blanchard, Jr. | 307/296.4 |
| 4,446,381 | 5/1984 | Dalrymple | 307/272.3 |
| 4,466,074 | 8/1984 | Jindrick et al. | 307/296.4 |
| 4,611,126 | 9/1986 | Miller | 307/272.3 |
| 4,788,454 | 11/1988 | Tanagawa | 307/272.3 |
| 5,111,067 | 5/1992 | Wong et al. | 307/272.3 |
| 5,140,183 | 8/1972 | Takenaka | 307/272.3 |

FOREIGN PATENT DOCUMENTS

| | | | |
|---|---|---|---|
| 48403 | 3/1984 | Japan | 307/272.3 |
| 48804 | 4/1988 | Japan | 307/272.3 |

Primary Examiner—Timothy P. Callahan
Assistant Examiner—T. Lam

[57] ABSTRACT

A circuit, responsive to the application of primary power, generates signals to establish the initial state of a logic circuit. Generated signals are interposed on the logic circuit's input signal line until initialization is complete. After initialization, the logic circuit's input signal line is recoupled for normal operation.

13 Claims, 4 Drawing Sheets

MEMORY DEVICE INITIALIZATION

This is a Continuation of U.S. application Ser. No. 08/052,003, filed Apr. 22, 1993, now U.S. Pat. No. 5,416,363.

FIELD OF THE INVENTION

The invention relates to the control of logic circuits, particularly to the generation of control signals that may be required to establish a condition in a logic circuit.

BACKGROUND OF THE INVENTION

Conventional logic circuits require initialization after application of primary power. Improper, and perhaps unpredictable operations would ensue without initialization. Initialization generally refers to the process of preparing a logic circuit for normal operations. For example, a counting circuit would be set to zero during initialization, a control sequencer would be set to a monitoring as opposed to a controlling state, and a microprocessor would, among other actions, clear internal arithmetic registers. The process of initialization may vary with the complexity of the logic circuit.

Initialization of a logic circuit may require several transitions of a clock signal. Conventional logic circuits incorporate storage elements such as flip-flops, registers, and memory, often with feedback so that the future content of the storage element depends on the current content. A flip-flop, which ordinarily requires a clock signal to change its content, may require a clock signal to establish an intended initial content. When power is first applied to a storage element the content of the storage element may be unpredictable. However, the intended initial content of controlling storage elements (the initial state) of the circuit is established after the circuit receives a predetermined number of clock signals. More than one clock signal would be required, for example, when the content of a successive storage element can be set only by the output of a preceding storage element. In that case, a first clock signal would clear the first element and a second clock signal would clear the second element.

Clock signals are conventionally provided by circuitry external to the logic circuit. To initialize a circuit having storage elements may require an initialization signal characterized by a logic level, such as a low-true reset signal, a signal transition from one logic state to another logic state, such as a clock signal transition, or a succession of such transitions, such as a pulse, a pattern of transitions, or a pulse train. When the complexity of the initialization signal would add undue complexity to a single logic circuit and the logic circuit designer can anticipate that several identical logic circuits would be used together in a system or product, the logic circuit designer specifies the initialization signal requirements and the system designer implements these requirements in a circuit external to the logic circuit. Thus, a single external initialization circuit serves several identical logic circuits at the system level. By choosing not to implement an initialization circuit within each logic circuit, the logic circuit designer lowers the cost per unit of the logic circuit. However, the system design becomes more complex.

It is desirable to simplify systems design, especially requirements for system initialization. Systems are formed from the combination of many logic circuits of diverse types. The initialization circuit sufficient for a plurality of logic circuits of a first type can be unsatisfactory for initializing logic circuits of a second type. The system design must coordinate all requisite initialization circuits.

If the system design task was simplified, reliable, lower cost systems could reach the market in less development time. Development and testing of systems consume time and resources to an extent directly proportional to system complexity. System reliability is also directly proportional to system complexity and closely related to the time and resources available for system design and product testing.

Thus, as more complex products become feasible, there remains a need to simplify the systems designed into such products, particularly the processes and circuits performing logic circuit initialization.

SUMMARY OF THE INVENTION

Accordingly, a subsystem of the present invention includes an initialization circuit and a logic circuit to be initialized. The subsystem is responsive to a power signal for a logic circuit and an input signal for the logic circuit. After receiving the power signal, the subsystem temporarily drives an initialization signal into the logic circuit input, thus accomplishing logic circuit initialization. Components of the subsystem include a power signal threshold detector, an initialization signal generator, and a signal selection circuits. The detector monitors the power signal and enables the signal generator when power sufficient for logic circuit operation has been received. The generator, which in one embodiment includes a gated oscillator, provides a sequence of initialization signals to establish the initial state of the logic circuit. After the power signal is received, the signal selection circuit first routes the sequence of initialization signals to the logic circuit so that the logic circuit is initialized. Then, the signal selection circuit routes the input signal for the logic circuit to the logic circuit for normal operations following initialization.

According to a first aspect of the present invention, signals intended for a logic circuit are not coupled to the logic circuit until the logic circuit has been initialized. The system designer need not take steps to prevent signals from being coupled to the logic circuit prior to initialization, thus simplifying system design.

According to another aspect of the present invention, all necessary signals for causing the logic circuit to attain an initial state are provided by the present invention. The system designer who chooses to incorporate the present invention into a system design need not account for variation in initialization requirements which may arise during the product cycle of the logic circuit and the product cycle of the target system. Likewise, the manufacturer of the logic circuit has greater freedom to develop improved and fully compatible logic circuit designs which may have different initialization requirements.

According to yet another aspect of the present invention, initialization of the logic circuit is begun as soon as sufficient power is applied, resulting in improved responsiveness of systems incorporating the present invention.

According to still another aspect of the present invention, initialization is begun when sufficient primary power is detected. Upon the removal and reapplication of power, however instantaneously, proper operation of the logic circuit is assured beginning from its intended initial state.

A method of the present invention quickly satisfies initialization requirements of a logic circuit. Such a method includes, though not necessarily in order, the following steps: detecting the application of power for the logic circuit;

enabling a signal generator to generate an initialization signal; coupling the initialization signal to the logic circuit while the initialization signal is being generated; and isolating the input signal from the logic circuit while the initialization signal is being generated.

These and other aspects, advantages, and features of the present invention will become apparent by reference to the following description of the invention in conjunction with the referenced drawing figures.

DETAILED DESCRIPTION OF THE INVENTION

Figure 1:
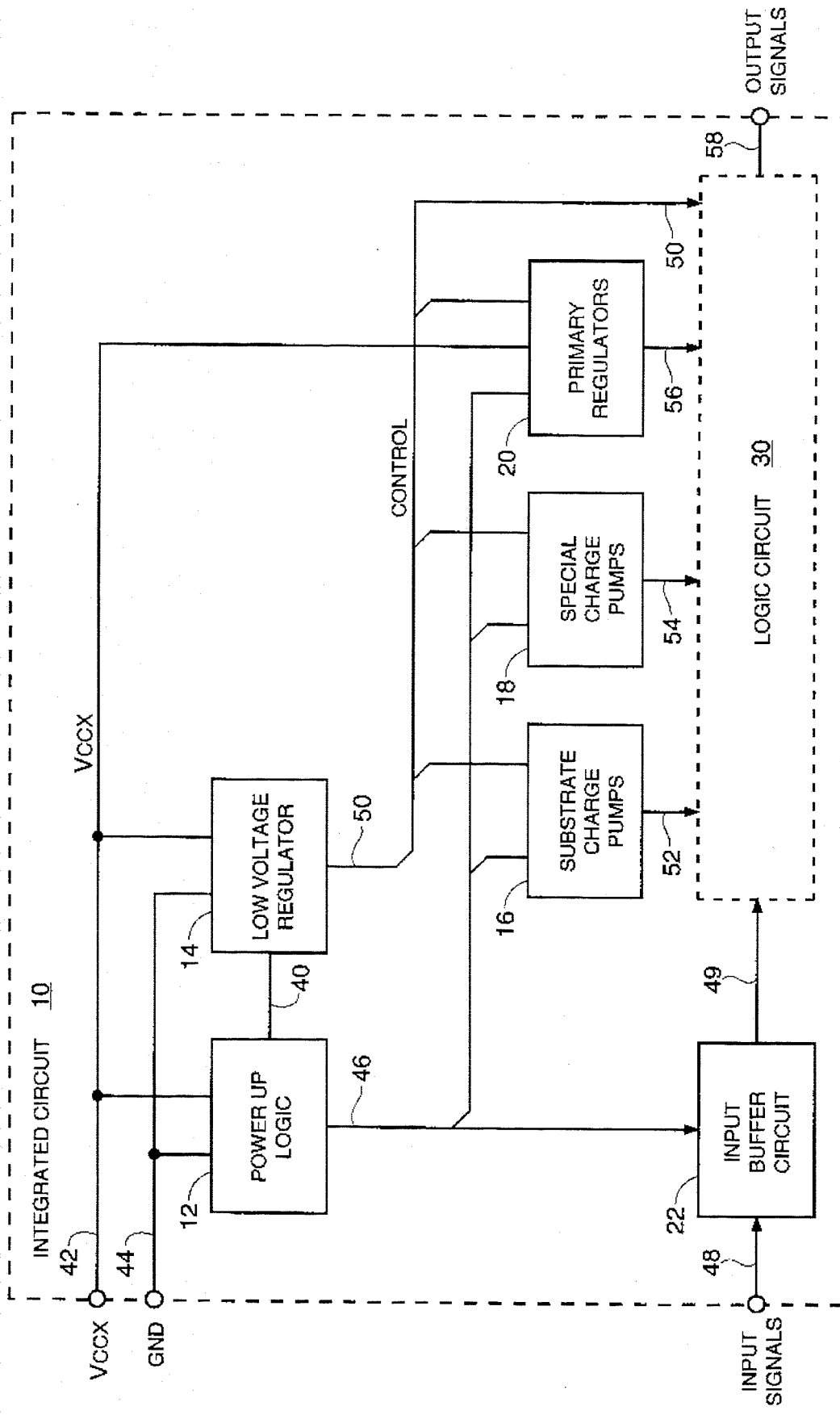
FIG. 1 is a functional block diagram of an integrated circuit of the present invention. A single line between functional blocks represents one or more signals. Signals that appear on several figures and have the same mnemonic are directly or indirectly coupled together.

FIG. 1 is a functional block diagram of an integrated circuit of the present invention. Integrated circuit 10 is an integrated circuit having conventional logic functions shown generally as logic circuit 30, and connections for power signals 42 ($V_{ccx}$), ground conductor 44 (GND), at least one input shown generally as input signal 48 and at least one output shown generally as output signal 58. Output signal 58 is not necessary and may be deleted when the function of logic circuit 30 does not require provision of an output signal. As shown logic circuit 30 uses power and control signals for initialization and operation.

Power signals provided to logic circuit 30 are derived from power signals 42. When logic circuit 30 requires multiple power signals for operation, integrated circuit 10 includes low voltage regulator 14 and primary regulators 20. Low voltage regulator 14 provides intermediate power signals 50, coupled as required to substrate charge pumps 16, special charge pumps 18, and primary regulators 20. Substrate charge pumps 16 provide power signals 52 coupled to logic circuit 30. Special charge pumps 18 provide power signals 54 coupled to logic circuit 30. Primary regulators 20 provide power signals 56 coupled to logic circuit 30. When logic circuit 30 required fewer power signals for operation, intermediate power signals 50 may be eliminated and related simplifications may be employed as is well known in the art.

Low voltage regulator 14 receives power and control signals 40 provided by power up logic 12. Control signals 40 enable and govern the operation of low voltage regulator 14. Similarly control signals 46, provided by power up logic 12 enable and govern the operation of substrate charge pumps 16, special charge pumps 18, and primary regulators 20. The sequence of enablement of these several functional blocks depends on the circuitry of each functional block and upon the power signal sequence requirements of logic circuit 30.

Control signals used to initialize logic circuit 30 are provided by power up logic 12 as control signals 46. Control signals 46 enable input buffer circuit 22. As will be described with reference to FIG. 3, power up logic 12 includes initialization signal generation capability and input buffer circuit 22 includes signal selection capability to accomplish initialization according to the present invention. Before describing a circuit embodiment of the initialization process we now turn to a timing description of that process.

Figure 2:
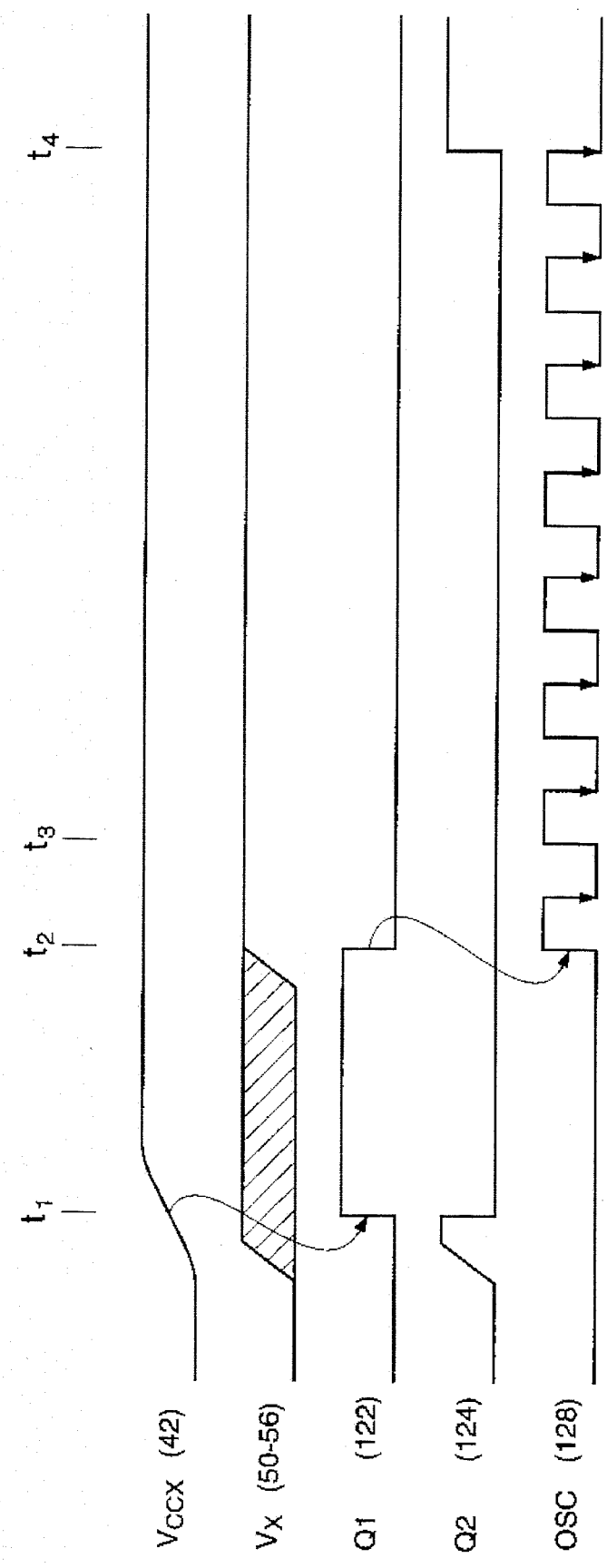
FIG. 2 is a timing diagram depicting signals generated by power up logic 12 and input buffer circuit 22 shown in FIG. 1. The vertical axis represents binary logic levels and the horizontal axis represents time. Neither axis is drawn to scale. The vertical axis is intended to show the transition from active (asserted) to passive (non-asserted) levels of each logic signal. The voltage levels corresponding to the logic levels of the various signals are not necessarily identical among the various signals.

FIG. 2 is a timing diagram depicting signals generated by power up logic 12 and input buffer circuit 22 shown in FIG. 1. Power signals 42 generally describe primary power required for operation of logic circuit 30. In one embodiment, power signals 42 comprise one positive voltage called $V_{ccx}$. Other embodiments may comprise voltage and/or current signals of various polarity.

At time T1, $V_{ccx}$ exceeds a threshold voltage sufficient for operation of power up logic circuits 12. During the time between time T1 and time T2, low voltage regulator 14 begins to operate, substrate charge pumps 16, special charge pumps 18, and primary regulators 20 are enabled, begin operation, and are coupled to logic circuit 30. As power signals 50 through 56 ramp to operating levels, Q2 signal 124 ramps to a logic hugh level.

Also at time T1, signals Q1 and Q2 are triggered to measure predetermined durations indicated by their respective pulse widths. The pulse width of Q1 signal 122 is designed to allow for sufficient time for power signals to be developed and coupled to logic circuit 30. For Q1, typical pulse widths range from a few microseconds to tens of milliseconds, though the present invention does not necessitate an upper or lower limit. The pulse width of Q2 signal 124 is designed to allow for sufficient time for initialization signals to be generated and coupled to logic circuit 30. For Q2, typical pulse widths are longer than the pulse width of Q1 by an amount ranging from tens of nanoseconds to a few milliseconds.

At time T2, Q1 signal 122 falls. When both Q1 and Q2 are low, initialization signals shown generally as OSC signal 128, are generated and coupled to logic circuit 30. The duration and complexity of initialization signals depend on the complexity and design of logic circuit 30. At time T4 all initialization signals have been generated and logic circuit 30 is prepared for normal operations.

The conventional DRAM includes an array of memory cells arranged in a matrix having rows and intersecting columns and means for reading stored data from the array. Multiplex addressing is conventional wherein a group of lines conveys a row address and, subsequently, a column address. A row address strobe (RAS*) signal is used as an input to strobe in the row address to the means for reading and a column address strobe (CAS,) signal is used as another input to strobe in the column address to the means for reading. The means for reading conventionally includes circuitry that requires initialization.

The number of high to low transitions of OSC signal 128 shown in FIG. 2 meet the minimum requirement for initialization of a conventional dynamic random access memory (DRAM). The conventional DRAM is initialized by application of a minimum of 8 pulses applied to the row address strobe (RAS*) input. Therefore, in one embodiment of the present invention, logic circuit 30 includes a conventional DRAM, input signals 48 include RAS*, and OSC signal 128 is inverted and coupled to initialize the DRAM after application of $V_{ccx}$. From time T1 to time T4 externally applied RAS* signals are decoupled from logic circuit 30 and OSC signal 128 is coupled in its place. At or after time T4, externally applied RAS* signals are coupled to logic circuit 30 for normal operations and OSC signal 128 is decoupled from logic circuit 30. The signals election function is best understood by considering a circuit schematic depicting an implementation of the initialization process described above.

Figure 3:
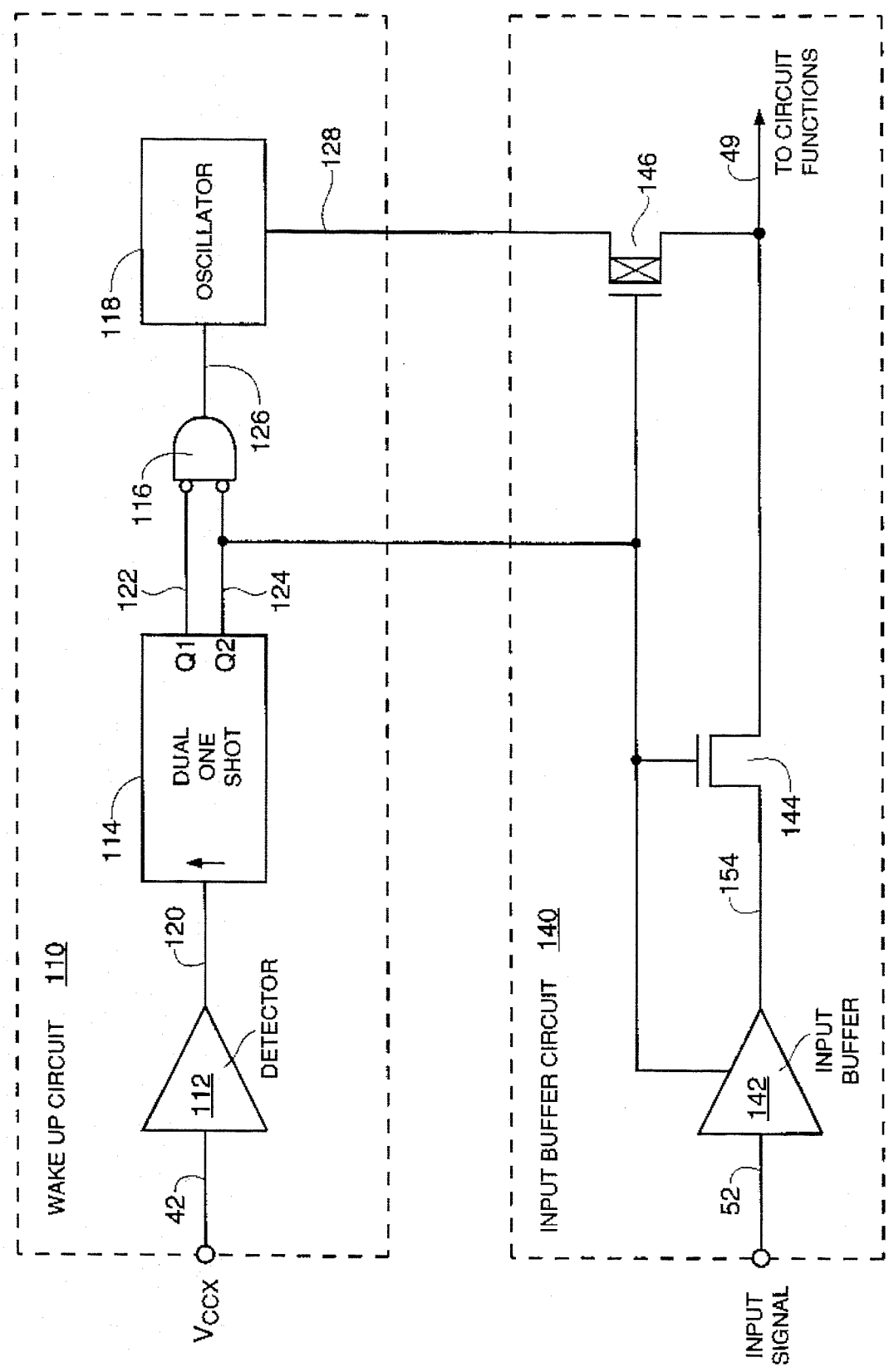
FIG. 3 is a schematic diagram of a portion of power up logic 12 and input buffer circuit 22 shown in FIG. 1.

FIG. 3 is a schematic diagram of one embodiment of a portion of power up logic 12 and input buffer circuit 22 shown in FIG. 1. Input buffer circuit 140 is included in the functions of input buffer circuit 22. Wake up circuit 110 is included in the functions of power up logic 12. Signal names and reference numbers shown on FIG. 3 correspond generally to those shown on FIG. 2.

Wake up circuit 110 monitors power signal 42, $V_{ccx}$. Detector 112, coupled to $V_{ccx}$, generates a low to high transition on signal line 120. Dual one shot multivibrator 114 is coupled to signal line 120 and is triggered by the low to high transition on signal line 120 to generate a logic high pulse on output Q1 and a logic low pulse on output Q2. Multivibrator 114 in this circuit serves as a timer. Alternate timing circuits including capacitive charging circuits are well known in the art and would suffice. Signals Q1 and Q2 are coupled to logic gate 116 which generates gating signal 26. Oscillator 118 is coupled to gating signal 126 and generates OSC signal 128 when enabled by a high logic level or gating signal 126.

Q2 signal 124 is coupled to input buffer 142, and transistors 144 and 146. When Q2 is low, input buffer 142 is disabled. Therefore, buffered input signal line 154 is decoupled from input signal 52. Transistor 144 is off when Q2 is low, ensuring that input signal 52 is not coupled to input signal line 49. In an alternate embodiment, input buffer 142 is eliminated because transistor 144 provides sufficient decoupling capability. In still another alternate embodiment, transistor 144 is eliminated because disabling input buffer 142 via signal Q2 provides sufficient decoupling capability. In yet another embodiment, not shown, input buffer 142 is disabled by decoupling power from input buffer 142. In addition, when Q2 is low, transistor 146 is on and OSC signal 126 is coupled to signal 49 which drives logic circuit 30.

When Q2 signal 124 is high, input buffer 142 is enabled and buffered input signal line 154 is coupled to input signal 52. A logic high on Q2 turns on transistor 144 and, therefore, couples buffered input signal line 154 to input signal line 49. Conversely, a logic high on Q2 turns off transistor 146 and, therefore, isolates and decouples OSC signal 128 from input signal line 49. Transistors 144 and 146 perform signal selection, coupling, and isolation functions.

Figure 4:
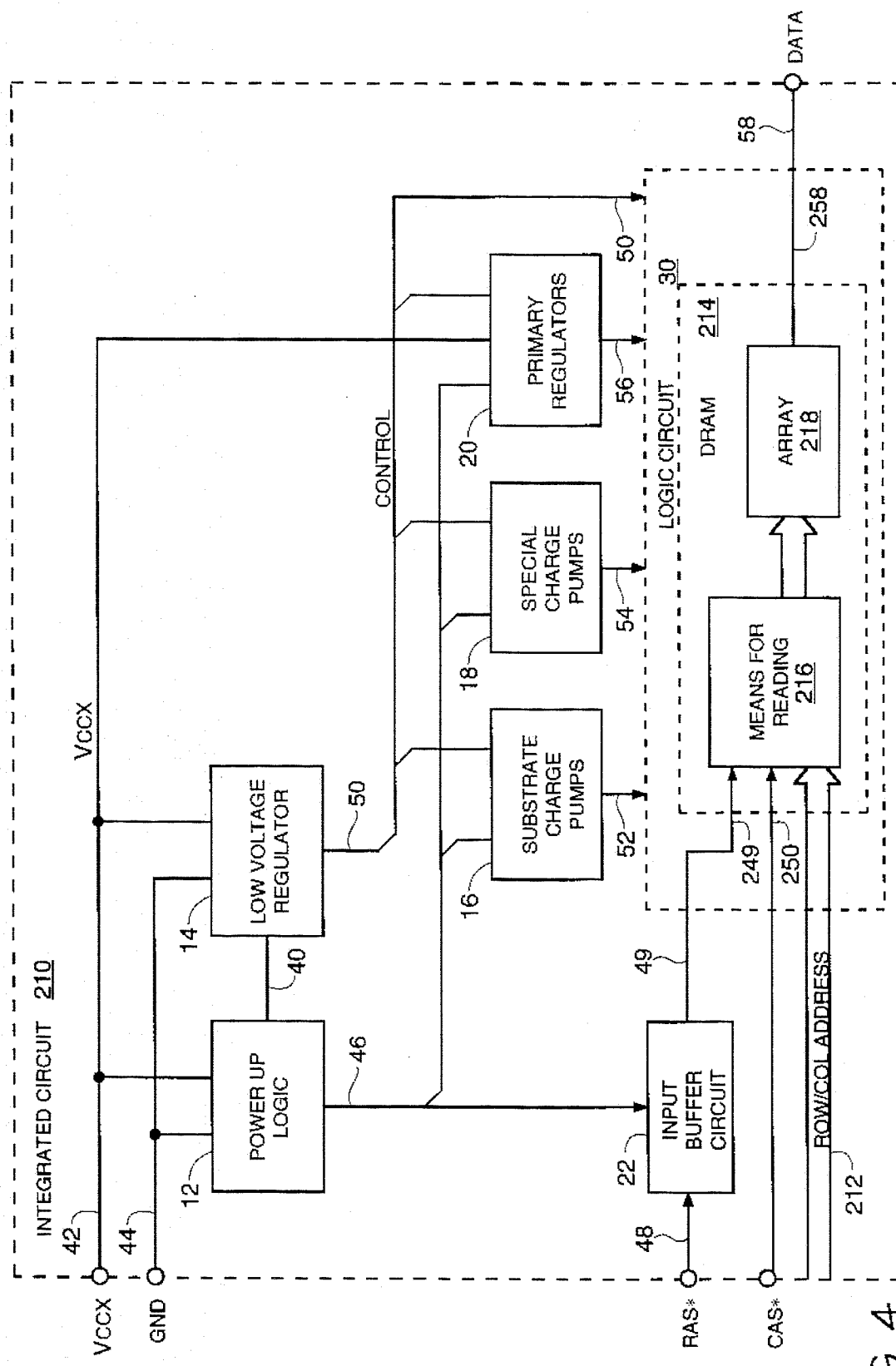
FIG. 4 is a functional block diagram of an integrated circuit of the present invention including dynamic random access memory.

FIG. 4 is a functional block diagram of an integrated circuit of the present invention wherein logic circuit 30 includes dynamic random access memory (DRAM) 214. Integrated circuit 210 is similar to integrated circuit 10 as to similarly numbered items already described. Input signal 48 includes signal RAS*; and output signal 58 includes DATA signal 258. Circuit 214 is initialized by signal 49 which includes OSC signal 128 as described with reference to FIGS. 2 and 3. Circuit 214 includes an array of memory cells 218 and means for reading a cell of the array 216. The means for reading receives address signals 212 and includes an input node for receiving input signal 249. Thus, means for reading is initialized by receiving signal 249 which includes OSC signal 128 and subsequently includes signal RAS* for selection of a memory cell to be read.

Integrated circuit 10 shown in FIG. 1 illustrates an embodiment of the present invention. When logic circuit 30 is fabricated as an integrated circuit, the present invention would generally be implemented as integrated circuit 10, fabricated simultaneously with logic circuit 30. In addition, other packaging design choices besides integrated circuitry can be made without departing from the scope and spirit of the present invention. For example, a system of the present invention may be packaged as a hybrid circuit, a circuit card assembly, a subassembly, or a completed electro/mechanical assembly. The scope of the present invention is intended to be limited only by a proper interpretation of the appended claims.

The words and phrases used in the specification and claims are intended to be broadly construed. A "system" refers generally to electrical apparatus and includes but is not limited to a packaged integrated circuit, an unpackaged integrated circuit, a combination of packaged or unpackaged integrated circuits or both, a microprocessor, a microcontroller, a memory, a register, a gate, a flip-flop, a charge-coupled device, combinations thereof, and equivalents. A logic circuit is a system including, but is not limited to, binary digital circuits, arithmetic circuits, switching circuits, and decision making circuits employed for measurement, computation, signaling, or control. A "signal" refers to mechanical and/or electromagnetic energy conveying information. When elements are coupled, a signal can be conveyed in any manner feasible in light of the nature of the coupling. For example, if several electrical conductors couple two elements, then the relevant signal comprises the energy on one, some, or all conductors at a given time or time period. When a physical property of a signal has a quantitative measure and the property is used by design to control or communicate information, then the signal is said to be characterized by having a "value." For a binary (digital) signal, the two characteristic values are called logic "levels".

What is claimed is:

1. A memory that receives a power signal and an input signal, the memory comprising:

a. a plurality of memory cells;

b. means for reading information from and writing information to said plurality of memory cells;

c. an input node connected to said means for reading and writing;

d. a first circuit that provides a first signal after receiving the power signal; and e. a switch that couples the first signal to the input node at a first time and couples the input signal to the input node at a second time, wherein the memory is responsive to the first signal for initialization and to the input signal for operation.

2. The memory of claim 1 wherein the first circuit comprises a timer that is triggered in response to the power signal.

3. The memory of claim 2 wherein:

a. the first circuit further comprises a signal generator coupled to the timer; and b. the signal generator provides the first signal in response to the timer.

4. The memory of claim 3 wherein:

a. the operation of the timer is characterized by a period of time; and b. generation of the first signal by the signal generator is disabled after lapse of the period of time.

5. The memory of claim 2 wherein the timer is retriggerable in response to a variation of the power signal.

6. The memory of claim 5 wherein:

a the first circuit further comprises a signal generator coupled to the timer; and b. the signal generator provides the first signal in response to the timer.

7. The memory of claim 6 wherein:

a. the operation of the timer is characterized by a period of time; and b. generation of the first signal by the signal generator is disabled after lapse of the period of time.

8. The memory of claim 1 further comprising a semiconductor substrate comprising the input node, the first circuit, and the switch.

9. The memory of claim 8 wherein:

a. the memory further comprises an input contact, coupled to the input node; and b. the input contact receives the input signal onto the substrate.

10. An integrated circuit comprising a self-initializing system, the system responsive to a power signal and an input signal, the system comprising:

a. a memory powered by the power signal and having an input node for receiving the input signal;

b. a first circuit that provides an initialization signal to the input node in response to the power signal; and c. a second circuit in response to the power signal for isolating the input signal from the input node while the initialization signal is coupled to the memory for initialization of the memory and coupling the input signal to the memory after receiving the initialization signal.

11. The integrated circuit of claim 10 wherein the second circuit comprises:

a. a timer that provides a first timer signal in response to the power signal; and b. switch means for decoupling the input signal from the memory in response to the first timer signal.

12. The integrated circuit of claim 11 wherein:

said switch means also decouples the initialization signal from the memory in response to the first timer signal.

13. An integrated circuit comprising a self-initialization system, the system responsive to a power signal and an input signal, the system comprising:

a. means for generating an initialization signal, the means for generating responsive to the power signal, the means for generating providing the initialization signal after receiving the power signal;

b. a memory circuit responsive to the power signal for receiving operative power and having an input node for receiving the input signal; and c. means for isolating, the means for isolating coupled to the means for generating and responsive to the initialization signal, the means for isolating responsive to the input signal, the means for isolating coupled to the input node for decoupling the input signal from the input node while the initialization signal is being generated, wherein the means for isolating comprises:

(1) a timer triggered by the power signal, the timer providing a timer signal a time after the power signal is received; and (2) selecting means responsive to the timer signal for isolating the input signal from the memory circuit until the timer signal is received and for isolating the initialization signal from the memory circuit after the timer signal is received.

* * * * *